US012620991B2

(12) United States Patent

Ngo

(10) Patent No.: US 12,620,991 B2

(45) Date of Patent: May 5, 2026

(54) SEMICONDUCTOR INTEGRATED CIRCUIT AND RECEIVER DEVICE

(71) Applicant: Kioxia Corporation, Tokyo (JP)

(72) Inventor: Huy Cu Ngo, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 111 days.

(21) Appl. No.: 18/598,221

(22) Filed: Mar. 7, 2024

(65) Prior Publication Data

US 2024/0313769 A1      Sep. 19, 2024

(30) Foreign Application Priority Data

Mar. 15, 2023      (JP) ................................. 2023-041277

(51) Int. Cl.
*H03K 17/687* (2006.01)
*H03K 5/01* (2006.01)

(52) U.S. Cl.
CPC ........... *H03K 17/6871* (2013.01); *H03K 5/01* (2013.01)

(58) Field of Classification Search
CPC ............................. H03K 17/6871; H03K 5/01
See application file for complete search history.

(56) References Cited

U.S. PATENT DOCUMENTS 6,862,041 B2      3/2005  Haraguchi
10,404,265 B1 *  9/2019  Farley ................... H03M 1/802

FOREIGN PATENT DOCUMENTS

| JP | 3422170 | B2 | 6/2003 |
|----|---------|----|--------|
| JP | 3595483 | B2 | 12/2004 |
| JP | 2013150229 | A | 8/2013 |

OTHER PUBLICATIONS

Shifman et al., "A 1.64mW Differential Super Source-Follower Buffer with 9. 7GHz BW and 43dB PSRR for Time-Interleaved ADC Applications in 10nm", IEEE Asian Solid-State Circuits Conference (A-SSCC), 2019, 4 pages.

* cited by examiner

*Primary Examiner* — Metasebia T Retebo

(74) *Attorney, Agent, or Firm* — Maier & Maier, PLLC

(57)      ABSTRACT

A semiconductor integrated circuit includes a first input terminal inputting a first signal, a second input terminal supplied to a first voltage, an output terminal outputting a second signal. The circuit includes: a first transistor having first, second, control terminals respectively connected to a first node, the output terminal and first input terminals; a second transistor having first, second, control terminals respectively connected to the first and second nodes, the output terminal; a third transistor having a first terminal supplied to a second voltage, second and control terminals respectively connected to the first node and the second input terminal; a fourth transistor having first and control terminals respectively connected to the output terminal and the second node, a second terminal supplied to a third voltage; and a fifth transistor having first and control terminals connected to the second node, and a second terminal supplied to the third voltage.

20 Claims, 5 Drawing Sheets

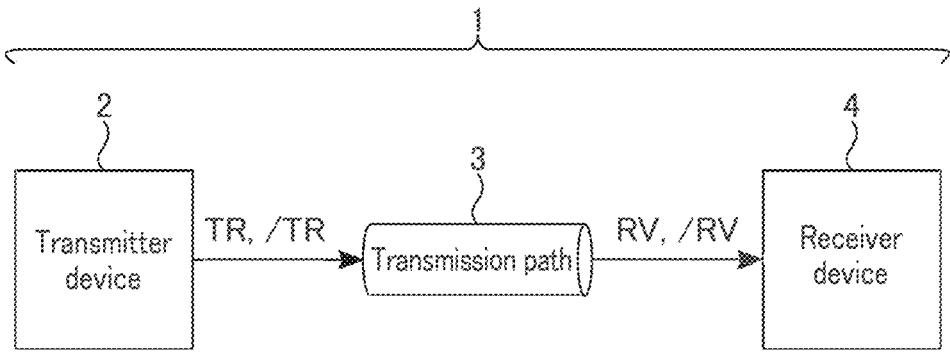
F I G. 1
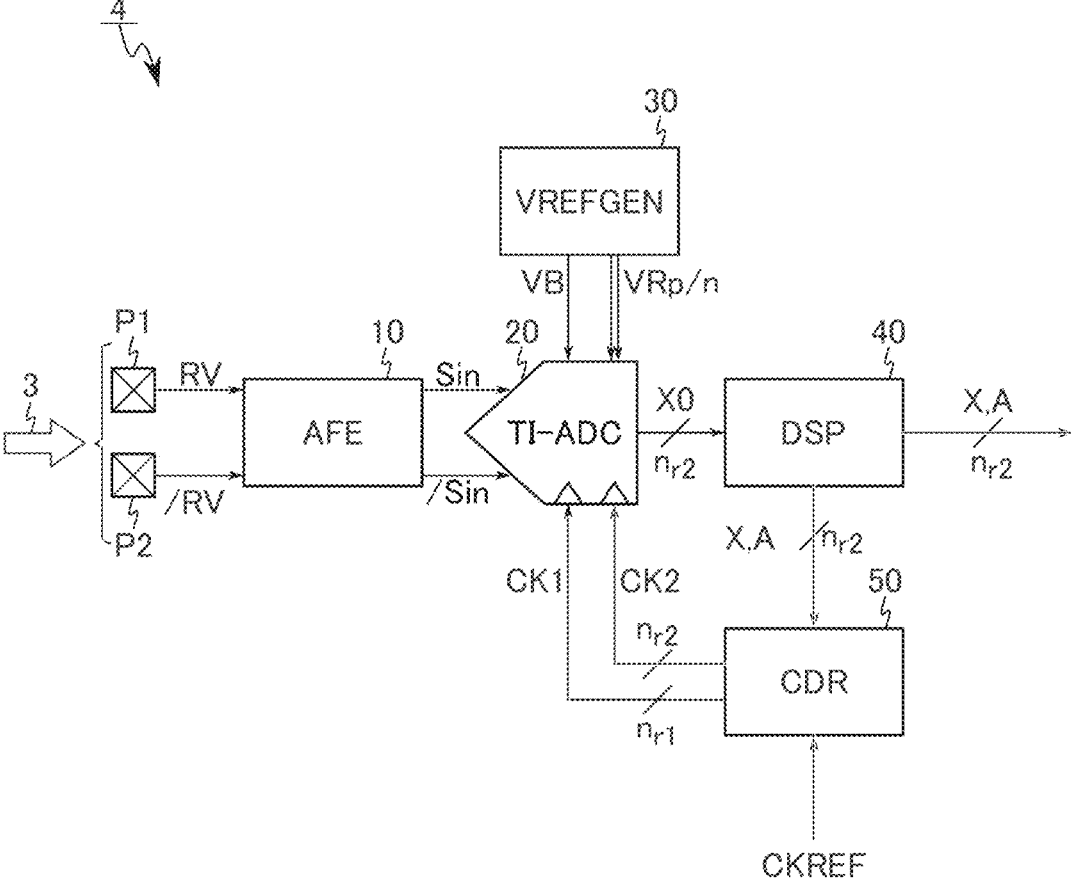
F I G. 2

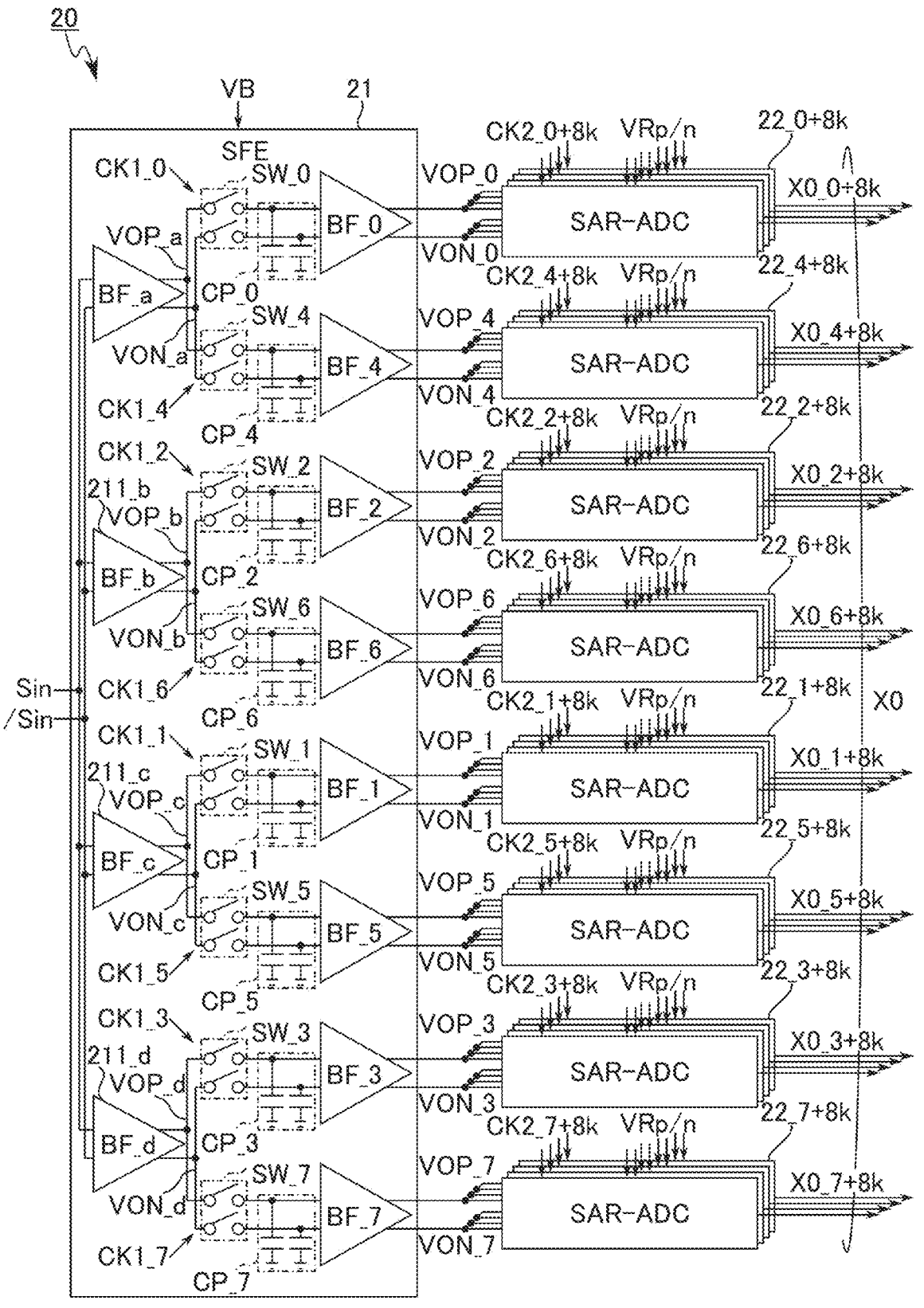
F I G. 3

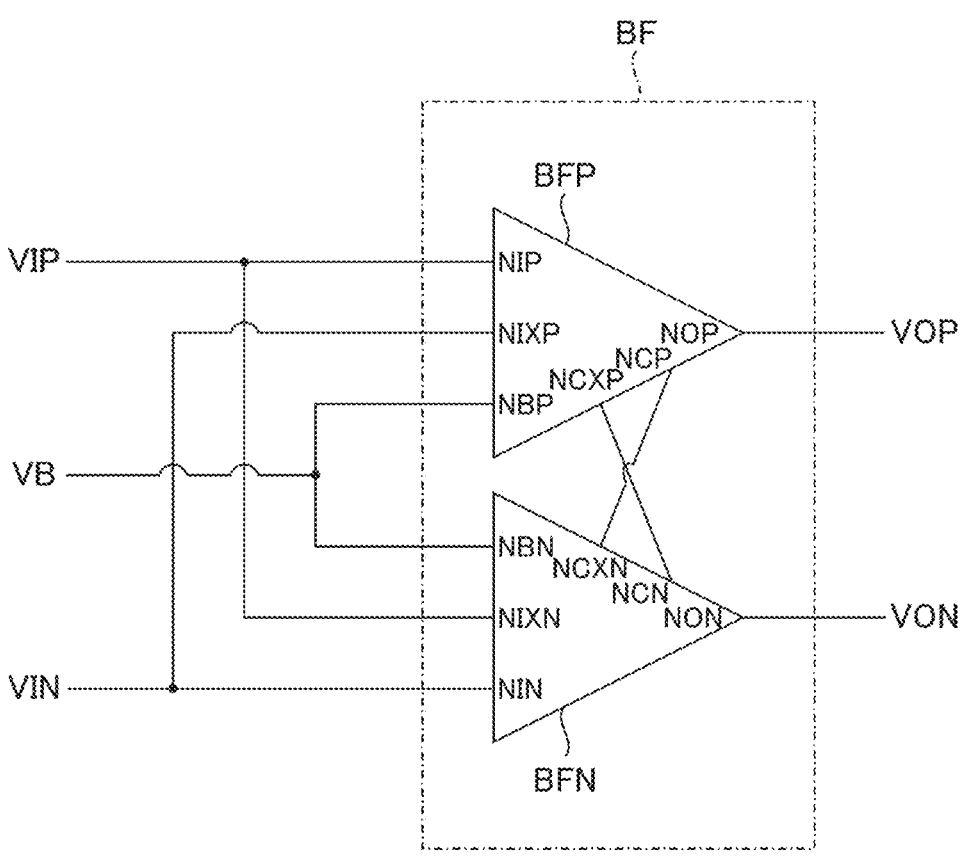
F I G. 4

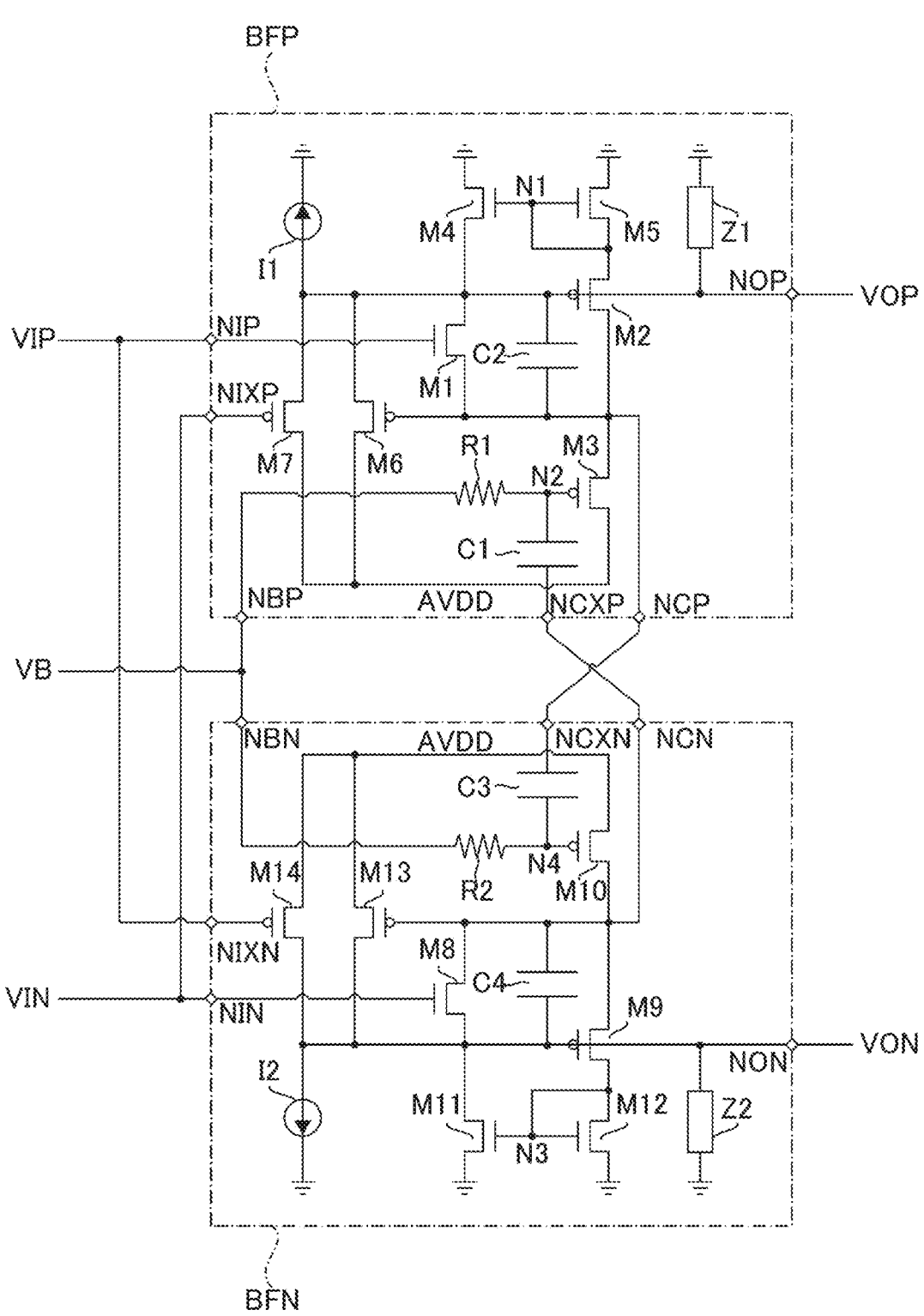
F I G . 5

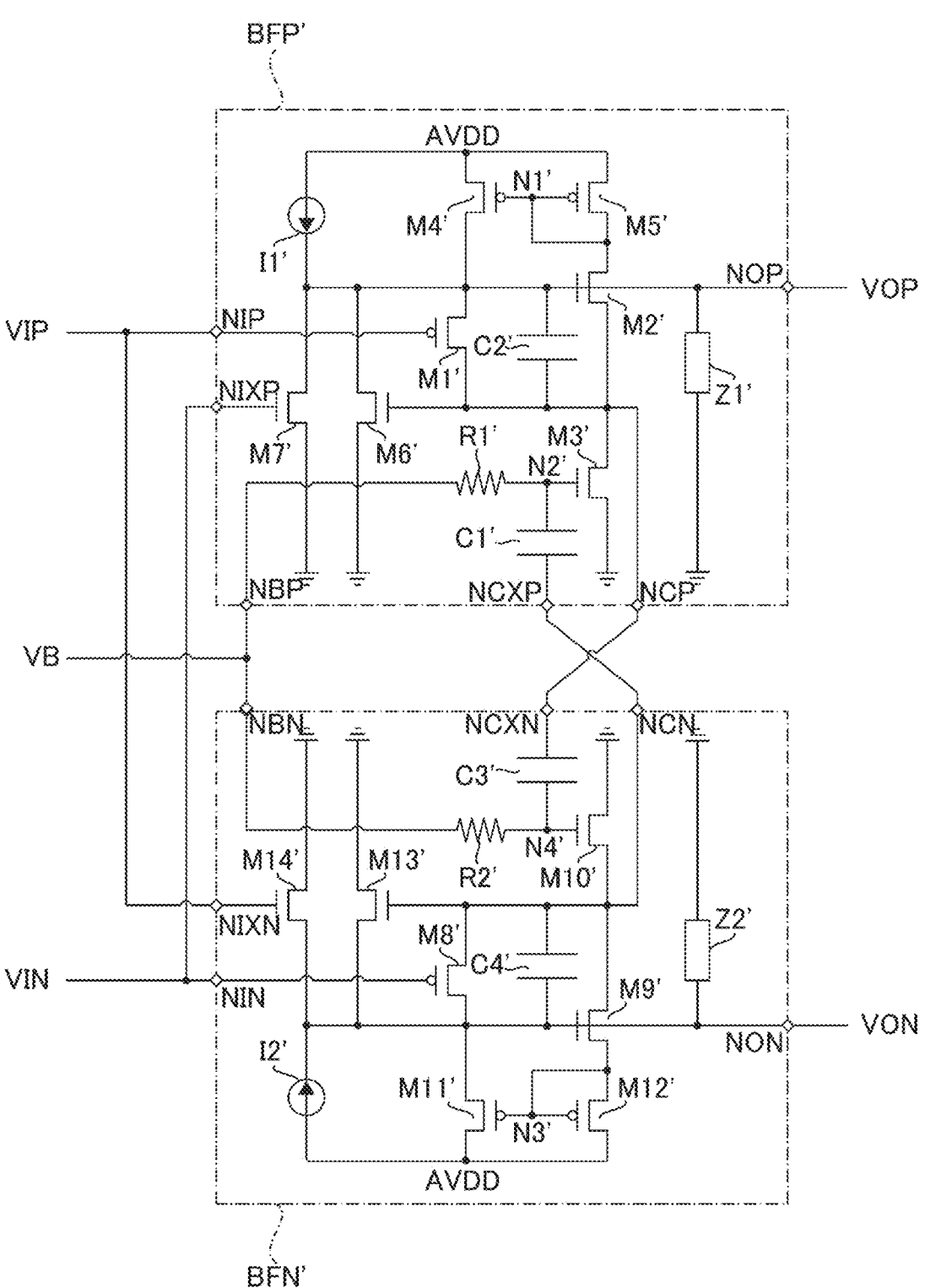
F I G. 6

SEMICONDUCTOR INTEGRATED CIRCUIT AND RECEIVER DEVICE

CROSS-REFERENCE TO RELATED APPLICATIONS

This application is based upon and claims the benefit of priority from Japanese Patent Application No. 2023-041277, filed Mar. 15, 2023, the entire contents of which are incorporated herein by reference.

FIELD

Embodiments described herein relate generally to a semiconductor integrated circuit and a receiver device.

BACKGROUND

A transmitter device and a receiver device are connected via a transmission path. The transmitter device superimposes data on an analog signal and outputs the analog signal. The receiver device receives the analog signal that has passed through the transmission path. The receiver device includes a semiconductor integrated circuit that processes the analog signal. The receiver device generates a digital signal based on the analog signal. The receiver device recovers the data based on the generated digital signal.

BRIEF DESCRIPTION OF DRAWINGS

FIG. 1 is a block diagram illustrating an example of a configuration of a communication system including a receiver device according to an embodiment.

FIG. 2 is a block diagram illustrating an example of a configuration of a receiver circuit included in the receiver device according to the embodiment.

FIG. 3 is a block diagram illustrating an example of a configuration of an AD converter included in the receiver circuit according to the embodiment.

FIG. 4 is a block diagram illustrating an example of a configuration of a buffer included in the AD converter according to the embodiment.

FIG. 5 is a circuit diagram illustrating an example of a configuration of the buffer included in the AD converter according to the embodiment.

FIG. 6 is a circuit diagram illustrating an example of a configuration of a buffer included in an AD converter according to a modification.

DETAILED DESCRIPTION

In general, according to one embodiment, a semiconductor integrated circuit includes a first buffer having a first input terminal to which a first signal is input, a second input terminal to which a first voltage is supplied, and a first output terminal from which a second signal is output. The first buffer includes a first transistor, a second transistor, a third transistor, a fourth transistor, and a fifth transistor. The first transistor has a first terminal connected to a first node, a second terminal connected to the first output terminal, and a control terminal connected to the first input terminal. The second transistor has a first terminal connected to the first node, a second terminal connected to a second node, and a control terminal connected to the first output terminal. The third transistor has a first terminal to which a second voltage is supplied, a second terminal connected to the first node, and a control terminal connected to the second input terminal. The fourth transistor has a first terminal connected to the first output terminal, a second terminal to which a third voltage is supplied, and a control terminal connected to the second node. The fifth transistor has a first terminal and a control terminal each connected to the second node, and a second terminal to which the third voltage is supplied.

Embodiments will be described below with reference to the drawings.

Note that, in the following description, components having substantially the same functions and configurations are denoted by the same reference numerals. In a case where elements having similar configurations are particularly distinguished from each other, letters or numbers different from each other may be added to the ends of the same reference numerals.

1. Embodiment

An embodiment will be described.

1.1 Communication System

A configuration of a communication system including a receiver device according to the embodiment will first be described. FIG. 1 is a block diagram illustrating an example of a configuration of the communication system including the receiver device according to the embodiment.

A communication system 1 is configured to transmit data from one device or circuit to another device or circuit by high-speed serial communication. Specifically, for example, the communication system 1 achieves a communication speed of 128 Gbps. The communication system 1 includes a transmitter device 2, a transmission path 3, and a receiver device 4. The communication system 1 may be constituted by a plurality of devices or circuits provided on the same printed circuit board, or may be constituted by a plurality of devices or circuits provided on different printed circuit board.

The transmitter device 2 is configured to transmit signals TR and /TR to the receiver device 4 via the transmission path 3. The signals TR and /TR are differential signals. The signals TR and /TR are, for example, signals including a plurality of pulse signals. Data is superimposed on each pulse signal of the signals TR and /TR. The voltage level of each pulse signal of the signals TR and /TR corresponds to data of one or more bits. The data superimposed on the pulse signal is transmitted from the transmitter device 2 to the receiver device 4 via the transmission path 3.

The transmission path 3 is a physical or spatial transmission medium for transmitting the signals TR and /TR to the receiver device 4. The transmission path 3 is, for example, wiring that connects the transmitter device 2 and the receiver device 4. The transmission path 3 may have various transmission characteristics depending on the structure and material of the transmission medium. The transmission characteristics of the transmission path 3 have, for example, a frequency characteristic with a loss of gain in a specific frequency band.

The signals TR and /TR transmitted by the transmitter device 2 pass through the transmission path 3, thereby suffering a loss corresponding to the transmission characteristics of the transmission path 3. Thus, inter-symbol interference (ISI) occurs in the signals TR and /TR that have passed through the transmission path 3. Therefore, the signals TR and /TR that have passed through the transmission path 3 are processed as analog signals in an initial stage circuit of the receiver device 4. In the following, the signals TR and /TR that have passed through the transmission path 3 and have suffered loss are referred to as signals RV and /RV.

The receiver device 4 is configured to receive the signals RV and /RV from the transmitter device 2 via the transmission path 3. The receiver device 4 decodes the data superimposed on the signals TR and /TR by the transmitter device 2 based on the signals RV and /RV. The receiver device 4 has a receiver circuit for correctly decoding data superimposed on the signals TR and /TR. The receiver circuit may be referred to as a semiconductor integrated circuit.

1.2 Receiver Circuit

FIG. 2 is a block diagram illustrating an example of a configuration of a receiver circuit of the receiver device according to the embodiment.

The receiver device 4 includes, for example, pads P1 and P2, a AFE 10, a TI-ADC 20, a VREFGEN 30, a DSP 40, and a CDR 50 as a receiver circuit.

Each of the pads P1 and P2 is a terminal connected to the transmission path 3. The example of FIG. 2 illustrates a case where the pads P1 and P2 receive the signals RV and /RV, respectively, from the transmitter device 2 via the transmission path 3.

The AFE 10 is an analog front end. The AFE 10 includes, for example, a continuous time linear equalizer (CTLE) and a variable gain amplifier (VGA). The CTLE is an amplifier circuit having a frequency characteristic that compensates for the frequency characteristic of the transmission path 3. The VGA is an amplifier circuit capable of changing a gain. The signals RV and /RV are input to the AFE 10 from the pads P1 and P2, respectively. The AFE 10 performs analog processing on the signals RV and /RV using the CTLE and the VGA. The AFE 10 generates signals Sin and /Sin based on the signals RV and /RV. In other words, the signals Sin and /Sin are analog signals, as are the signals RV and /RV. The AFE 10 outputs the signals Sin and /Sin to the TI-ADC 20.

The TI-ADC 20 is a time-interleaved AD converter. In the communication system 1 that achieves 128 Gbps, in a case where the bit depth is 2 bits, the TI-ADC 20 achieves, for example, a sampling rate of 64 GS/s. In this case, the Nyquist frequency of the TI-ADC 20 is 32 GHz. The TI-ADC 20 performs a process of converting an analog signal to a digital signal. The signals Sin and /Sin are input to the TI-ADC 20 from the AFE 10. A bias voltage VB and reference voltages VRp and VRn (VRp/n) are input to the TI-ADC 20 from the VREFGEN 30. Signals CK1 and CK2 are input to the TI-ADC 20 from the CDR 50. The TI-ADC 20 converts the signals Sin and /Sin to a signal X0 based on the reference voltages VRp and VRn, and the signals CK1 and CK2. The TI-ADC 20 outputs the signal X0 to the DSP 40. The configuration of the TI-ADC 20 will be described later.

The bias voltage VB is a voltage used in a process of buffering an analog signal in the TI-ADC 20.

The reference voltages VRp and VRn are voltages used in the process of converting the analog signal to the digital signal in the TI-ADC 20. The TI-ADC 20 generates the signal X0 based on the magnitude relation between the potential difference between the signals Sin and /Sin and the potential difference (VRp–VRn) between the reference voltages VRp and VRn.

The signal CK1 includes $n_{r1}$ clock signals. $n_{r1}$ is an integer greater than or equal to 1 (e.g., 8). The $n_{r1}$ clock signals of the signal CK1 differ in phase by at least $360°/n_{r1}$, for example. In the following, the $n_{r1}$ clock signals in the signal CK1 may be indicated by being distinguished as in signals CK1_0, . . . , and CK1_$n_{r1}$–1). The frequency of the signal CK1 is equal to or lower than the frequency of clock signal embedded in the signals TR and /TR by the transmitter device 2.

The signal CK2 includes $n_{r2}$ clock signals. $n_{r2}$ is an integer greater than $n_{r1}$ (e.g., 32). The $n_{r2}$ clock signals of the signal CK2 differ in phase by at least $360°/n_{r2}$, for example. In the following, the $n_{r2}$ clock signals in the signal CK2 may be indicated by being distinguished as in signals CK2_0, . . . , and CK2_($n_{r2}$–1). The frequency of the signal CK2 is lower than the clock signal embedded in the signals TR and /TR by the transmitter device 2.

The signal X0 output by the TI-ADC 20 is a digital signal. The signal X0 includes a plurality of consecutive digital values. One digital value included in the signal X0 is sampled from one symbol of the signals Sin and /Sin based on one clock signal (specifically, an edge of the clock signal) of the signal CK2. One digital value is, for example, 8-bit data. The value of each bit of the $n_{r2}$ consecutive digital values included in the signal XC is sampled from the $n_{r2}$ consecutive symbols of the signals Sin and /Sin based on the $n_{r2}$ clock signals of the signal CK2. In the following, the generation period of the $n_{r2}$ consecutive digital values included in the signal X0 by the TI-ADC 20 is also simply referred to as a "period". The $n_{r2}$ consecutive digital values included in the signal X0 are also referred to as a "signal X0 for one period".

In addition, the $n_{r2}$ consecutive digital values included in the signal X0 may be indicated by being distinguished as in digital values X0_0, . . . , and X0_($n_{r2}$–1). The 8-bit data string included in the digital value X0_$j$ may be indicated as in a bit string X0_$j$<7:0> ($0≤j≤n_{r2}$–1). Note that the bit string X0_$j$<7:0> means a data string in which eight bits from the most significant bit (MSB)X0_$j$<7> to the least significant bit (LSB)X0_$j$<0> are arranged in order.

The VREFGEN 30 is a voltage generator. The VREFGEN 30 is configured to generate a bias voltage VB and reference voltages VRp and VRn.

The DSP 40 is a digital signal processor. The DSP 40 includes, for example, a feed forward equalizer (FFE), a decision feedback equalizer (DFE), and a data determination circuit. The signal X0 is input to the DSP 40. The DSP 40 performs digital processing on the signal X0 using, for example, the FFE, DFE, and data determination circuit. Specifically, the DSP 40 generates a signal X and data A based on the signal X0. The DSP 40 outputs the signal X and the data A to the CDR 50. The DSP 40 outputs the signal X and data A to a subsequent processing circuit (not illustrated). In the subsequent processing circuit, the signal X and the data A are processed. The signal X and the data A output to the CDR 50 and the signal X and the data A output to the subsequent processing circuit (not illustrated) may be the same signals or different signals, respectively.

The signal X is a digital signal, as is the signal X0. The signal X for one period is a set of $n_{r2}$ digital values. The data A is data decoded based on the signal X.

The CDR 50 is a clock data recovery circuit. The signal X and the data A are input to the CDR 50 in each period. For example, a reference clock signal CKREF is input to the CDR 50 from the transmitter device 2. The reference clock signal CKREF may be generated in the CDR 50 or in the receiver device 4 independently of the transmitter device 2. The CDR 50 calculates phase correction amount of the signals CK1 and CK2 based on the reference clock signal CKREF and the signal X and the data A. The CDR 50 recovers the signals CK1 and CK2 based on the calculated phase correction amount. The CDR 50 outputs the recovered signals CK1 and CK2 to the TI-ADC 20 in each period. As described above, the CDR 50 recovers the signals CK1 and CK2 serving as the reference of the sampling timing of the subsequent signal X0 for one period, based on the signal X and data A which are generated from the signal X0 for one period. Such cyclical processing for each period by the TI-ADC 20, the DSP 40, and the CDR 50 is also referred to as a "CDR loop".

In the following, a case where (8, 32) is applied as a specific combination of (n$_{r1}$, n$_{r2}$) will be described.

1.3 AD Converter

The internal configuration of the AD converter (TI-ADC) included in the receiver circuit according to the embodiment will now be described. FIG. 3 is a block diagram illustrating an example of the configuration of the AD converter included in the receiver circuit according to the embodiment.

The TI-ADC 20 includes an SFE 21 and a plurality of SAR-ADCs 22. The plurality of SAR-ADCs 22 includes 32 SAR-ADCs 22_0, . . . , and 22_31. In the example of FIG. 3, the four SAR-ADCs 22_0, 22_8, 22_16, and 22_24 are indicated as "SAR-ADC 22_0+8k" (0≤k≤3). Similarly, the four SAR-ADCs 22_1, 22_9, 22_17, and 22_25 are indicated as "SAR-ADC 22_1+8k". The four SAR-ADCs 22_2, 22_10, 22_18, and 22_26 are indicated as "SAR-ADC 22_2+8k". The four SAR-ADCs 22_3, 22_11, 22_19, and 22_27 are indicated as "SAR-ADC 22_3+8k". The four SAR-ADCs 22_4, 22_12, 22_20, and 22_28 are indicated as "SAR-ADC 22_4+8k". The four SAR-ADCs 22_5, 22_13, 22_21, and 22_29 are indicated as "SAR-ADC 22_5+8k". The four SAR-ADCs 22_6, 22_14, 22_22, and 22_30 are indicated as "SAR-ADC 22_6+8k". The four SAR-ADCs 22_7, 22_15, 22_23, and 22_31 are indicated as "SAR-ADC 22_7+8k".

The SFE 21 is a sampling front end. The bias voltage VB is supplied to the SFE 21. The SFE 21 includes a plurality of buffers BF, a plurality of switching elements SW, and a plurality of capacitors CP. The plurality of buffers BF includes four first-stage buffers BF_a, BF_b, BF_c, and BF_d, and eight second-stage buffers BF_0, BF_1, BF_2, BF_3, BF_4, BF_5, BF_6, and BF_7. Each of the four first-stage buffers BF_a to BF_d and each of the eight second-stage buffers BF_0 to BF_7 has a first input terminal, a second input terminal, a first output terminal, and a second output terminal. The plurality of switching elements SW includes eight switching element groups SW_0, SW_1, SW_2, SW_3, SW_4, SW_5, SW_6, and SW_7. Each of the eight switching element groups SW_0 to SW_7 includes two switching elements. The plurality of capacitors CP includes eight capacitor groups CP_0, CP_1, CP_2, CP_3, CP_4, CP_5, CP_6, and CP_7. Each of the eight capacitor groups CP_0 to CP_7 includes two capacitors. The four first-stage buffers BF_a to BF_d and the eight second-stage buffers BF_0 to BF_7 may each have an equivalent configuration. In the following, in a case where each of the four first-stage buffers BF_a to BF_d and each of the eight second-stage buffers BF_0 to BF_7 are not distinguished from each other, these buffers are simply referred to as "buffers BF".

A signal Sin is input to the first input terminal of each of the first-stage buffers BF_a to BF_d. A signal /Sin is input to the second input terminal of each of the first-stage buffers BF_a to BF_d.

A voltage VOP_a is output from the first output terminal of the first-stage buffer BF_a. The first output terminal of the first-stage buffer BF_a is connected to respective first terminals of one of the switching elements in the switching element group SW_0 and one of the switching elements in the switching element group SW_4. A voltage VON_a is output from the second output terminal of the first-stage buffer BF_a. The second output terminal of the first-stage buffer BF_a is connected to respective first terminals of the other of the switching elements in the switching element group SW_0 and the other of the switching elements in the switching element group SW_4.

A voltage VOP_b is output from the first output terminal of the first-stage buffer BF_b. The first output terminal of the first-stage buffer BF_b is connected to respective first terminals of one of the switching elements in the switching element group SW_2 and one of the switching elements in the switching element group SW_6. A voltage VON_b is output from the second output terminal of the first-stage buffer BF_b. The second output terminal of the first-stage buffer BF_b is connected to respective first terminals of the other of the switching elements in the switching element group SW_2 and the other of the switching elements in the switching element group SW_6.

A voltage VOP_c is output from the first output terminal of the first-stage buffer BF_c. The first output terminal of the first-stage buffer BF_c is connected to respective first terminals of one of the switching elements in the switching element group SW_1 and one of the switching elements in the switching element group SW_5. A voltage VON_c is output from the second output terminal of the first-stage buffer BF_c. The second output terminal of the first-stage buffer BF_c is connected to respective first terminals of the other of the switching elements in the switching element group SW_1 and the other of the switching elements in the switching element group SW_5.

A voltage VOP_d is output from the first output terminal of the first-stage buffer BF_d. The first output terminal of the first-stage buffer BF_d is connected to respective first terminals of one of the switching elements in the switching element group SW_3 and one of the switching elements in the switching element group SW_7. A voltage VON_d is output from the second output terminal of the first-stage buffer BF_d. The second output terminal of the first-stage buffer BF_d is connected to respective first terminals of the other of the switching elements in the switching element group SW_3 and the other of the switching elements in the switching element group SW_7.

A second terminal of one of the switching elements in the switching element group SW_0 is connected to a first terminal of one of the capacitors in the capacitor group CP_0 and the first input terminal of the second-stage buffer BF_0. A second terminal of the other of the switching elements in the switching element group SW_0 is connected to a first terminal of the other of the capacitors in the capacitor group CP_0 and the second input terminal of the second-stage buffer BF_0. A second terminal of each of the two capacitors in the capacitor group CP_0 is grounded. Being grounded means being connected to wiring to which a reference potential (e.g., a voltage AVSS=0 V) is applied when the SFE 21 operates. In a case where the signal CK1_0 is at the "H" level, the switching element group SW_0 is turned on. In a case where the signal CK1_0 is at the "L" level, the switching element group SW_0 is turned off.

A second terminal of one of the switching elements in the switching element group SW_1 is connected to a first terminal of one of the capacitors in the capacitor group CP_1 and the first input terminal of the second-stage buffer BF_1. A second terminal of the other of the switching elements in the switching element group SW_1 is connected to a first terminal of the other of the capacitors in the capacitor group CP_1 and the second input terminal of the second-stage buffer BF_1. A second terminal of each of the two capacitors in the capacitor group CP_1 is grounded. In a case where the signal CK1_1 is at the "H" level, the switching element group SW_1 is turned on. In a case where the signal CK1_1 is at the "L" level, the switching element group SW_1 is turned off.

A second terminal of one of the switching elements in the switching element group SW_2 is connected to a first terminal of one of the capacitors in the capacitor group CP_2 and the first input terminal of the second-stage buffer BF_2. A second terminal of the other of the switching elements in the switching element group SW_2 is connected to a first terminal of the other of the capacitors in the capacitor group CP_2 and the second input terminal of the second-stage buffer BF_2. A second terminal of each of the two capacitors in the capacitor group CP_2 is grounded. In a case where the signal CK1_2 is at the "H" level, the switching element group SW_2 is turned on. In a case where the signal CK1_2 is at the "L" level, the switching element group SW_2 is turned off.

A second terminal of one of the switching elements in the switching element group SW_3 is connected to a first terminal of one of the capacitors in the capacitor group CP_3 and the first input terminal of the second-stage buffer BF_3. A second terminal of the other of the switching elements in the switching element group SW_3 is connected to a first terminal of the other of the capacitors in the capacitor group CP_3 and the second input terminal of the second-stage buffer BF_3. A second terminal of each of the two capacitors in the capacitor group CP_3 is grounded. In a case where the signal CK1_3 is at the "H" level, the switching element group SW_3 is turned on. In a case where the signal CK1_3 is at the "L" level, the switching element group SW_3 is turned off.

A second terminal of one of the switching elements in the switching element group SW_4 is connected to a first terminal of one of the capacitors in the capacitor group CP_4 and the first input terminal of the second-stage buffer BF_4. A second terminal of the other of the switching elements in the switching element group SW_4 is connected to a first terminal of the other of the capacitors in the capacitor group CP_4 and the second input terminal of the second-stage buffer BF_4. A second terminal of each of the two capacitors in the capacitor group CP_4 is grounded. In a case where the signal CK1_4 is at the "H" level, the switching element group SW_4 is turned on. In a case where the signal CK1_4 is at the "L" level, the switching element group SW_4 is turned off.

A second terminal of one of the switching elements in the switching element group SW_5 is connected to a first terminal of one of the capacitors in the capacitor group CP_5 and the first input terminal of the second-stage buffer BF_5. A second terminal of the other of the switching elements in the switching element group SW_5 is connected to a first terminal of the other of the capacitors in the capacitor group CP_5 and the second input terminal of the second-stage buffer BF_5. A second terminal of each of the two capacitors in the capacitor group CP_5 is grounded. In a case where the signal CK1_5 is at the "H" level, the switching element group SW_5 is turned on. In a case where the signal CK1_5 is at the "L" level, the switching element group SW_5 is turned off.

A second terminal of one of the switching elements in the switching element group SW_6 is connected to a first terminal of one of the capacitors in the capacitor group CP_6 and the first input terminal of the second-stage buffer BF_6. A second terminal of the other of the switching elements in the switching element group SW_6 is connected to a first terminal of the other of the capacitors in the capacitor group CP_6 and the second input terminal of the second-stage buffer BF_6. A second terminal of each of the two capacitors in the capacitor group CP_6 is grounded. In a case where the signal CK1_6 is at the "H" level, the switching element group SW_6 is turned on. In a case where the signal CK1_6 is at the "L" level, the switching element group SW_6 is turned off.

A second terminal of one of the switching elements in the switching element group SW_7 is connected to a first terminal of one of the capacitors in the capacitor group CP_7 and the first input terminal of the second-stage buffer BF_7. A second terminal of the other of the switching elements in the switching element group SW_7 is connected to a first terminal of the other of the capacitors in the capacitor group CP_7 and the second input terminal of the second-stage buffer BF_7. A second terminal of each of the two capacitors in the capacitor group CP_7 is grounded. In a case where the signal CK1_7 is at the "H" level, the switching element group SW_7 is turned on. In a case where the signal CK1_7 is at the "L" level, the switching element group SW_7 is turned off.

The voltages VOP_0 and VON_0 are output from the first output terminal and the second output terminal of the second-stage buffer BF_0, respectively. Each of the first output terminal and the second output terminal of the second-stage buffer BF_0 is connected to the SAR-ADCs 22_0, 22_8, 22_16, and 22_24.

The voltages VOP_1 and VON_1 are output from the first output terminal and the second output terminal of the second-stage buffer BF_1, respectively. Each of the first output terminal and the second output terminal of the second-stage buffer BF_1 is connected to the SAR-ADCs 22_1, 22_9, 22_17, and 22_25.

The voltages VOP_2 and VON_2 are output from the first output terminal and the second output terminal of the second-stage buffer BF_2, respectively. Each of the first output terminal and the second output terminal of the second-stage buffer BF_2 is connected to the SAR-ADCs 22_2, 22_10, 22_18, and 22_26.

The voltages VOP_3 and VON_3 are output from the first output terminal and the second output terminal of the second-stage buffer BF_3, respectively. Each of the first output terminal and the second output terminal of the second-stage buffer BF_3 is connected to the SAR-ADCs 22_3, 22_11, 22_19, and 22_27.

The voltages VOP_4 and VON_4 are output from the first output terminal and the second output terminal of the second-stage buffer BF_4, respectively. Each of the first output terminal and the second output terminal of the second-stage buffer BF_4 is connected to the SAR-ADCs 22_4, 22_12, 22_20, and 22_28.

The voltages VOP_5 and VON_5 are output from the first output terminal and the second output terminal of the second-stage buffer BF_5, respectively. Each of the first output terminal and the second output terminal of the second-stage buffer BF_5 is connected to the SAR-ADCs 22_5, 22_13, 22_21, and 22_29.

The voltages VOP_6 and VON_6 are output from the first output terminal and the second output terminal of the second-stage buffer BF_6, respectively. Each of the first output terminal and the second output terminal of the second-stage buffer BF_6 is connected to the SAR-ADCs 22_6, 22_14, 22_22, and 22_30.

The voltages VOP_7 and VON_7 are output from the first output terminal and the second output terminal of the second-stage buffer BF_7, respectively. Each of the first output terminal and the second output terminal of the second-stage buffer BF_7 is connected to the SAR-ADCs 22_7, 22_15, 22_23, and 22_31.

With the above-described configuration, the second-stage buffer BF_0 receives the voltages VOP_a and VON_a and outputs the voltages VOP_0 and VON_0, at the timing when the signal CK1_0 has an "H" level. The second-stage buffer BF_1 receives the voltages VOP_c and VON_c and outputs the voltages VOP_1 and VON_1, at the timing when the signal CK1_1 has an "H" level. The second-stage buffer BF_2 receives the voltages VOP_b and VON_b and outputs the voltages VOP_2 and VON_2, at the timing when the signal CK1_2 has an "H" level. The second-stage buffer BF_3 receives the voltages VOP_d and VON_d and outputs the voltages VOP_3 and VON_3, at the timing when the signal CK1_3 has an "H" level. The second-stage buffer BF_4 receives the voltages VOP_a and VON_a and outputs the voltages VOP_4 and VON_4, at the timing when the signal CK1_4 has an "H" level. The second-stage buffer BF_5 receives the voltages VOP_c and VON_c and outputs the voltages VOP_5 and VON_5, at the timing when the signal CK1_5 has an "H" level. The second-stage buffer BF_6 receives the voltages VOP_b and VON_b and outputs the voltages VOP_6 and VON_6, at the timing when the signal CK1_6 has an "H" level. The second-stage buffer BF_7 receives the voltages VOP_d and VON_d and outputs the voltages VOP_7 and VON_7, at the timing when the signal CK1_7 has an "H" level.

Each of the SAR-ADC 22_0 to the SAR-ADC 22_31 is a successive approximation register AD converter. The signals CK2_0 to CK2_31 are input to the SAR-ADC 22_0 to the SAR-ADC 22_31, respectively. The reference voltages VRp and VRn are supplied to each of the SAR-ADC 22_0 to the SAR-ADC 22_31 via different wiring, respectively. The SAR-ADC 22_0 to the SAR-ADC 22_31 output the signals X0_0 to X0_31, respectively, based on the signals CK2_0 to CK2_31, and the reference voltages VRp and VRn, which are respectively correspondingly input. The SAR-ADC 22_0 to SAR-ADC 22_31 each have an equivalent configuration.

1.4 Buffer

FIG. 4 is a block diagram illustrating an example of the configuration of the buffer included in the AD converter according to the embodiment. FIG. 4 illustrates, as an example, a configuration of one buffer BF among the first-stage buffers BF_a to BF_d and the second-stage buffers BF_0 to BF_7, which have equivalent configurations.

The buffer BF functions as a differential input buffer. Specifically, the buffer BF includes two buffer units BFP and BFN. The buffer unit BFP has five input terminals NIP, NIXP, NBP, NCP, and NCXP, and one output terminal NOP. The buffer unit BFN has five input terminals NIN, NIXN, NBN, NCN, and NCXN, and one output terminal NON. The buffer units BFP and BFN have equivalent configurations.

A voltage VIP is supplied to the input terminal NIP of the buffer unit BFP and the input terminal NIXN of the buffer unit BFN. In a case where the buffer BF is any one of the first-stage buffers BF_a to BF_d, the voltage VIP is the voltage of the signal Sin. In a case where the buffer BF is the second-stage buffer BF_0 or BF_4, the voltage VIP is the voltage VOP_a. In a case where the buffer BF is the second-stage buffer BF_2 or BF_6, the voltage VIP is the voltage VOP_b. In a case where the buffer BF is the second-stage buffer BF_1 or BF_5, the voltage VIP is the voltage VOP_c. In a case where the buffer BF is the second-stage buffer BF_3 or BF_7, the voltage VIP is the voltage VOP_d.

A voltage VIN is supplied to the input terminal NIXP of the buffer unit BFP and the input terminal NIN of the buffer unit BFN. In the case where the buffer BF is any one of the first-stage buffers BF_a to BF_d, the voltage VIN is the voltage of the signal/Sin. In the case where the buffer BF is the second-stage buffer BF_0 or BF_4, the voltage VIN is the voltage VON_a. In the case where the buffer BF is the second-stage buffer BF_2 or BF_6, the voltage VIN is the voltage VON_b. In the case where the buffer BF is the second-stage buffer BF_1 or BF_5, the voltage VIN is the voltage VON_c. In the case where the buffer BF is the second-stage buffer BF_3 or BF_7, the voltage VIN is the voltage VON_d.

A bias voltage VB is supplied to the input terminal NBP of the buffer unit BFP and the input terminal NBN of the buffer unit BFN. The input terminal NCP of the buffer unit BFP is connected to the input terminal NCXN of the buffer unit BFN. The input terminal NCXP of the buffer unit BFP is connected to the input terminal NCN of the buffer unit BFN.

A voltage VOP is output from the output terminal NOP of the buffer unit BFP. In the case where the buffers BF are the first-stage buffers BF_a to BF_d, the voltages VOP are the voltages VOP_a to VOP_d, respectively. In a case where the buffers BF are the second-stage buffers BF_0 to BF_7, the voltages VOP are the voltages VOP_0 to VOP_7, respectively.

A voltage VON is output from the output terminal NON of the buffer unit BFN. In the case where the buffers BF are the first-stage buffers BF_a to BF_d, the voltages VON are the voltages VON_a to VON_d, respectively. In the case where the buffers BF are the second-stage buffers BF_0 to BF_7, the voltages VON are the voltages VON_0 to VON_7, respectively.

FIG. 5 is a circuit diagram illustrating an example of the configuration of the buffer included in the AD converter according to the embodiment. FIG. 5 illustrates details of the circuit configuration of the buffer units BFP and BFN illustrated in FIG. 4.

The buffer units BFP and BFN are buffers to which differential signals are input. Each of the buffer units BFP and BFN is a source follower. Specifically, the buffer unit BFP includes transistors M1, M2, M3, M4, M5, M6, and M7, capacitors C1 and C2, a resistor R1, a current source I1, a load Z1, and nodes N1 and N2. The buffer unit BFN includes transistors M8, M9, M10, M11, M12, M13, and M14, capacitors C3 and C4, a resistor R2, a current source I2, a load Z2, and nodes N3 and N4. The transistors M1, M4, M5, M8, M11, and M12 are N-conductivity type MOSFETs. The transistors M2, M3, M6, M7, M9, M10, M13, and M14 are P-conductivity type MOSFETs. The transistors M1 to M7 have characteristics equivalent to those of the transistors M8 to M14, respectively. The capacitors C1 and C3 have equivalent characteristics. The capacitors C2 and C4 have equivalent characteristics. The resistors R1 and R2 have equivalent characteristics. The current sources I1 and I2 have equivalent characteristics. The loads Z1 and Z2 have equivalent characteristics.

The circuit configuration of the buffer unit BFP will first be described.

The transistor M1 is a main source follower in the buffer unit BFP. The transistor M1 has a first terminal connected to the input terminal NCP, a second terminal connected to the output terminal NOP, and a control terminal connected to the input terminal NIP.

The transistor M2 has a first terminal connected to the input terminal NCP, a second terminal connected to the node N1, and a control terminal connected to the output terminal NOP.

The transistor M3 has a first terminal to which a voltage AVDD is supplied, a second terminal connected to the input terminal NCP, and a control terminal connected to the node N2. The voltage AVDD is a power supply voltage that drives the buffer BF.

The transistors M4 and M5 constitute a current mirror. The transistor M4 has a first terminal connected to the output terminal NOP, a second terminal grounded, and a control terminal connected to the node N1. The transistor M5 has a first terminal and a control terminal each connected to the node N1, and a second terminal grounded.

The transistor M6 has a first terminal to which the voltage AVDD is supplied, a second terminal connected to the output terminal NOP, and a control terminal connected to the input terminal NCP.

The transistor M7 has a first terminal to which the voltage AVDD is supplied, a second terminal connected to the output terminal NOP, and a control terminal connected to the input terminal NIXP.

The resistor R1 is a wiring resistor. The resistor R1 has a first terminal connected to the node N2 and a second terminal connected to the input terminal NBP.

The capacitor C1 has a first terminal connected to the node N2 and a second terminal connected to the input terminal NCXP.

The capacitor C2 has a first terminal connected to the input terminal NCP and a second terminal connected to the output terminal NOP.

The current source I1 has an input terminal connected to the output terminal NOP and an output terminal grounded.

The load Z1 has a first terminal connected to the output terminal NOP and a second terminal grounded.

A circuit configuration of the buffer unit BFN will now be described.

The transistor M8 is a main source follower in the buffer unit BFN. The transistor M8 has a first terminal connected to the input terminal NCN, a second terminal connected to the output terminal NON, and a control terminal connected to the input terminal NIN.

The transistor M9 has a first terminal connected to the input terminal NCN, a second terminal connected to the node N3, and a control terminal connected to the output terminal NON.

The transistor M10 has a first terminal to which a voltage AVDD is supplied, a second terminal connected to the input terminal NCN, and a control terminal connected to the node N4.

The transistors M11 and M12 constitute a current mirror. The transistor M11 has a first terminal connected to the output terminal NON, a second terminal grounded, and a control terminal connected to the node N3. The transistor M12 has a first terminal and a control terminal each connected to the node N3, and a second terminal grounded.

The transistor M13 has a first terminal to which the voltage AVDD is supplied, a second terminal connected to the output terminal NON, and a control terminal connected to the input terminal NCN.

The transistor M14 has a first terminal to which the voltage AVDD is supplied, a second terminal connected to the output terminal NON, and a control terminal connected to the input terminal NIXN.

The resistor R2 is a wiring resistor. The resistor R2 has a first terminal connected to the node N4 and a second terminal connected to the input terminal NBN.

The capacitor C3 has a first terminal connected to the node N4 and a second terminal connected to the input terminal NCXN.

The capacitor C4 has a first terminal connected to the input terminal NCN and a second terminal connected to the output terminal NON.

The current source I2 has an input terminal connected to the output terminal NON and an output terminal grounded.

The load Z2 has a first terminal connected to the output terminal NON and a second terminal grounded.

1.5 Effect According to Embodiment

In order to realize the TI-ADC 20 which operates at a high speed, the buffer BF which can secure a wide bandwidth (hereinafter simply referred to as a "bandwidth") in which a gain of the voltage VOP with respect to the voltage VIP (hereinafter simply referred to as a "gain") is greater than or equal to 0 dB is required. Specifically, in a TI-ADC 20 where a sampling rate of 64 GS/s is required, it is desirable that the bandwidth of the first-stage buffers BF_a to BF_d is, for example, greater than or equal to 32 GHz.

According to the embodiment, the transistor M1 functions as the main source follower in the buffer unit BFP. The transistor M3 functions as an element that determines the magnitude of the direct current flowing through the buffer unit BFP. The transistor M4 functions as an element that determines the magnitude of the direct current flowing through the transistor M1. The transistor M5 constitutes a current mirror with the transistor M4, thereby functioning as an element that determines the magnitude of the direct current flowing through the transistor M2. Thus, the transistors M2 and M5 can function as elements that improve the gain and linearity while keeping the voltage between the drain and source of the transistor M1 constant. Accordingly, it is possible to reduce the load of the compensation function in the CTLE and the VGA in the AFE 10.

Similarly, the transistor M8 functions as the main source follower in the buffer unit BFN. The transistor M10 functions as an element that determines the magnitude of the direct current flowing through the buffer unit BFN. The transistor M11 functions as an element that determines the magnitude of the direct current flowing through the transistor M8. The transistor M12 constitutes a current mirror with the transistor M11, thereby functioning as an element that determines the magnitude of the direct current flowing through the transistor M9. Thus, the transistors M9 and M12 can function as elements that improve the gain and linearity of the voltage VON with respect to the voltage VIN while keeping the voltage between the drain and source of the transistor M8 constant. Therefore, it is possible to reduce the load of the compensation function in the CTLE and the VGA in the AFE 10.

Note that, in a high frequency band, a pole may be formed by coupling of the resistors R1 and R2, which are wiring resistors, with the capacitance of the transistor M3 and the capacitance of the transistor M10, respectively. If the pole is formed, a gain characteristic in the high frequency band is deteriorated, which is not preferable. According to the embodiment, the capacitor C1 has the first terminal connected to the node N2 and the second terminal connected to the input terminal NCN via the input terminal NCXP. The capacitor C3 has the first terminal connected to the node N4 and the second terminal connected to the input terminal NCP via the input terminal NCXN. Thus, it is possible to suppress the deterioration of the gain characteristic in the high frequency band due to the resistor R1 and capacitance of the transistor M3, and the deterioration of the gain characteristic in the high frequency band due to the resistor R2 and the capacitance of the transistor M10. Accordingly, it is possible to extend the bandwidth of the buffer BF.

In addition, the transistor M7 has the first terminal to which the voltage AVDD is supplied, the second terminal connected to the output terminal NOP, and the control terminal to which the voltage VIN is supplied. The current source I1 has the input terminal connected to the output terminal NOP and the output terminal grounded. The transistor M14 has the first terminal to which the voltage AVDD is supplied, the second terminal connected to the output terminal NON, and the control terminal to which the voltage VIP is supplied. The current source I2 has the input terminal connected to the output terminal NON and the output terminal grounded. Thus, a pair of the transistor M7 and the current source I1 and a pair of the transistor M14 and the current source I2 can function as differential amplifiers. Therefore, it is possible to improve the gain characteristic over the entire frequency band. Accordingly, it is possible to reduce the load of the compensation function in the CTLE and VGA in the AFE 10, and to extend the bandwidth of the buffer BF.

In addition, the transistor M6 has the first terminal to which the voltage AVDD is supplied, the second terminal connected to the output terminal NOP, and the control terminal connected to the input terminal NCP. The transistor M13 has the first terminal to which the voltage AVDD is supplied, the second terminal connected to the output terminal NON, and the control terminal connected to the input terminal NCN. Thus, the transistors M6 and M13 can function as inverting amplifiers. Therefore, it is possible to reduce the output resistance of the voltages VOP and VON, and to improve the gain characteristic particularly in the high frequency band. Accordingly, it is possible to extend the bandwidth of the buffer BF.

In addition, the capacitor C2 has the first terminal connected to the input terminal NCP and the second terminal connected to the output terminal NOP. The capacitor C4 has the first terminal connected to the input terminal NCN and the second terminal connected to the output terminal NON. Thus, it is possible to improve the gain characteristic particularly in the high frequency band. Accordingly, it is possible to extend the bandwidth of the buffer BF.

2. Modifications

Note that the embodiment is not limited to the examples described above, and various modifications may be applied.

In the above-described embodiment, a case where the N-conductivity type MOSFET is applied to the main source follower in the buffer BF has been described, but the embodiment is not limited thereto. For example, a P-conductivity type MOSFET may be applied to the main source follower in the buffer BF. FIG. 6 is a circuit diagram illustrating an example of a configuration of a buffer included in an AD converter according to a modification. FIG. 6 corresponds to FIG. 5 in the embodiment. FIG. 6 illustrates buffer units BFP' and BFN'.

The buffer unit BFP' includes transistors M1', M2', M3', M4', M5', M6', and M7', a resistor R1', capacitors C1' and C2', a current source I1', and a load Z1'. The buffer unit BFN' includes transistors M8', M9', M10', M11', M12', M13', and M14', a resistor R2', capacitors C3' and C4', a current source I2', and a load Z2'. The transistors M1' to M14', the resistors R1' and R2', the capacitors C1' to C4', the current sources I1' and I2', and the loads Z1' and Z2' in the buffer units BFP' and BFN' correspond to the transistors M1 to M14, the resistors R1 and R2, the capacitors C1 to C4, the current sources I1 and I2, and the loads Z1 and Z2 in the buffer units BFP and BFN illustrated in FIG. 5, respectively. The configurations of the buffer units BFP' and BFN' are equivalent to the configurations of the buffer units BFP and BFN, except that the conductivity types of the internal transistors M1' to M14' and the relationship between the supplied voltages AVDD and AVSS are inverted from those of the buffer units BFP and BFN. Even if such buffer units BFP' and BFN' are used, it is possible to obtain the effects equivalent to those of the buffer units BFP and BFN.

In addition, in a case where the buffer BF has a two-stage configuration having the first-stage buffers BF_a to BF_d and the second-stage buffers BF_0 to BF_7, the buffers BF of the same conductivity type may be applied for each stage, or the buffers BF of different conductivity types may be applied for each stage. Specifically, for example, an N-conductivity type MOSFET may be applied to the main source follower in the first-stage buffers BF_a to BF_d, and a P-conductivity type MOSFET may be applied to the main source follower in the second-stage buffers BF_0 to BF_7. Which conductivity type of buffer BF is applied to which stage can be determined according to the magnitude of the direct current components of the voltages VIP and VIN, and the voltage AVDD to be input to the buffer BF.

In addition, in the above-described embodiment, a case where the buffer unit BFP includes the transistors M1 to M7, the resistor R1, the capacitors C1 and C2, the current source I1, and the load Z1, and the buffer unit BFN includes the transistors M8 to M14, the resistor R2, the capacitors C3 and C4, the current source I2, and the load Z2 has been described, but the embodiment is not limited thereto. For example, the buffer units BFP and BFN may be configured not to include the capacitors C1 and C3, respectively. In the case of a configuration not including the capacitors C1 and C3, the input terminal NCP and the input terminal NCXN are not connected to each other, and the input terminal NCXP and the input terminal NCN are not connected to each other. For example, the buffer units BFP and BFN may also be configured not to include the transistor M7 and the current source I1, and the transistor M14 and the current source I2, respectively. In the case of the configuration not including the transistor M7 and the current source I1, and the transistor M14 and the current source I2, the input terminal NIP and the input terminal NIXN are not connected to each other, and the input terminal NIXP and the input terminal NIN are not connected to each other. For example, the buffer units BFP and BFN may also be configured not to include the transistors M6 and M13, respectively. For example, the buffer units BFP and BFN may also be configured not to include the capacitors C2 and C4, respectively.

In addition, in the above-described embodiment, a case where the signal to be input to the TI-ADC 20 is generated by using the buffer having a two-stage configuration has been described, but the embodiment is not limited thereto. The signal to be input to the TI-ADC 20 may be generated by a buffer having a one-stage configuration or may be generated by a buffer having a configuration of three or more stages.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A semiconductor integrated circuit comprising a first buffer having a first input terminal to which a first signal is input, a second input terminal to which a first voltage is supplied, and a first output terminal from which a second signal is output, wherein the first buffer includes:

a first transistor having a first terminal connected to a first node, a second terminal connected to the first output terminal, and a control terminal connected to the first input terminal;

a second transistor having a first terminal connected to the first node, a second terminal connected to a second node, and a control terminal connected to the first output terminal;

a third transistor having a first terminal to which a second voltage is supplied, a second terminal connected to the first node, and a control terminal connected to the second input terminal;

a fourth transistor having a first terminal connected to the first output terminal, a second terminal to which a third voltage is supplied, and a control terminal connected to the second node;

a fifth transistor having a first terminal and a control terminal each connected to the second node, and a second terminal to which the third voltage is supplied; and a sixth transistor or a third capacitor, the sixth transistor having a first terminal to which the second voltage is supplied, a second terminal connected to the first output terminal, and a control terminal connected to the first node, the third capacitor having a first terminal connected to the first node and a second terminal connected to the first output terminal.

2. The semiconductor integrated circuit according to claim 1, wherein the first buffer further has a third input terminal to which a third signal constituting differential signals with the first signal is input, and the first buffer further includes:

a seventh transistor having a first terminal to which the second voltage is supplied, a second terminal connected to the first output terminal, and a control terminal connected to the third input terminal; and a first current source having an input terminal connected to the first output terminal and an output terminal to which the third voltage is supplied.

3. The semiconductor integrated circuit according to claim 1, further comprising a second buffer having a third input terminal to which a third signal constituting differential signals with the first signal is input, a fourth input terminal to which the first voltage is supplied, and a second output terminal from which a fourth signal constituting differential signals with the second signal is output, wherein the second buffer includes:

an eighth transistor having a first terminal connected to a third node, a second terminal connected to the second output terminal, and a control terminal connected to the third input terminal;

a ninth transistor having a first terminal connected to the third node, a second terminal connected to a fourth node, and a control terminal connected to the second output terminal;

a tenth transistor having a first terminal to which the second voltage is supplied, a second terminal connected to the third node, and a control terminal connected to the fourth input terminal;

an eleventh transistor having a first terminal connected to the second output terminal, a second terminal to which the third voltage is supplied, and a control terminal connected to the fourth node; and a twelfth transistor having a first terminal and a control terminal each connected to the fourth node, and a second terminal to which the third voltage is supplied.

4. The semiconductor integrated circuit according to claim 3, wherein the first buffer further includes a first capacitor having a first terminal connected to the second input terminal and a second terminal connected to the third node, and the second buffer further includes a second capacitor having a first terminal connected to the fourth input terminal and a second terminal connected to the first node.

5. The semiconductor integrated circuit according to claim 3, further comprising:

a first converter configured to determine a first bit string from the second signal and the fourth signal based on a first clock signal; and a second converter configured to determine a second bit string from the second signal and the fourth signal based on a second clock signal shifted from the first clock signal by a first phase.

6. The semiconductor integrated circuit according to claim 5, wherein each of the first converter and the second converter is a successive approximation register AD converter.

7. The semiconductor integrated circuit according to claim 1, wherein the first transistor, the fourth transistor, and the fifth transistor have a first conductivity type, and the second transistor and the third transistor have a second conductivity type different from the first conductivity type.

8. The semiconductor integrated circuit according to claim 7, wherein the first conductivity type is an N-conductivity type, the second conductivity type is a P-conductivity type, and the second voltage is higher than the third voltage.

9. The semiconductor integrated circuit according to claim 7, wherein the first conductivity type is a P-conductivity type, the second conductivity type is an N-conductivity type, and the third voltage is higher than the second voltage.

10. The semiconductor integrated circuit according to claim 1, wherein the first buffer is a source follower.

11. A receiver device comprising:

the semiconductor integrated circuit according to claim 1; and a processing circuit configured to process a signal output from the semiconductor integrated circuit.

12. The receiver device according to claim 11, wherein the first buffer further has a third input terminal to which a third signal constituting differential signals with the first signal is input, and the first buffer further includes:

a seventh transistor having a first terminal to which the second voltage is supplied, a second terminal connected to the first output terminal, and a control terminal connected to the third input terminal; and a first current source having an input terminal connected to the first output terminal and an output terminal to which the third voltage is supplied.

13. The receiver device according to claim 11, further comprising a second buffer having a third input terminal to which a third signal constituting differential signals with the first signal is input, a fourth input terminal to which the first voltage is supplied, and a second output terminal from which a fourth signal constituting differential signals with the second signal is output, wherein the second buffer includes:

an eighth transistor having a first terminal connected to a third node, a second terminal connected to the second output terminal, and a control terminal connected to the third input terminal;

a ninth transistor having a first terminal connected to the third node, a second terminal connected to a fourth node, and a control terminal connected to the second output terminal;

a tenth transistor having a first terminal to which the second voltage is supplied, a second terminal connected to the third node, and a control terminal connected to the fourth input terminal;

an eleventh transistor having a first terminal connected to the second output terminal, a second terminal to which the third voltage is supplied, and a control terminal connected to the fourth node; and a twelfth transistor having a first terminal and a control terminal each connected to the fourth node, and a second terminal to which the third voltage is supplied.

14. The receiver device according to claim 13, wherein the first buffer further includes a first capacitor having a first terminal connected to the second input terminal and a second terminal connected to the third node, and the second buffer further includes a second capacitor having a first terminal connected to the fourth input terminal and a second terminal connected to the first node.

15. The receiver device according to claim 13, further comprising:

a first converter configured to determine a first bit string from the second signal and the fourth signal based on a first clock signal; and a second converter configured to determine a second bit string from the second signal and the fourth signal based on a second clock signal shifted from the first clock signal by a first phase.

16. The receiver device according to claim 15, wherein each of the first converter and the second converter is a successive approximation register AD converter.

17. The receiver device according to claim 11, wherein the first transistor, the fourth transistor, and the fifth transistor have a first conductivity type, and the second transistor and the third transistor have a second conductivity type different from the first conductivity type.

18. The receiver device according to claim 17, wherein the first conductivity type is an N-conductivity type, the second conductivity type is a P-conductivity type, and the second voltage is higher than the third voltage.

19. The receiver device according to claim 17, wherein the first conductivity type is a P-conductivity type, the second conductivity type is an N-conductivity type, and the third voltage is higher than the second voltage.

20. The receiver device according to claim 11, wherein the first buffer is a source follower.

\* \* \* \* \*